(12) United States Patent
Czyzewski

(10) Patent No.: US 7,336,338 B2
(45) Date of Patent: Feb. 26, 2008

(54) LIQUID-CRYSTAL INDICATOR OF VOLTAGE PRESENCE

(75) Inventor: Jan Czyzewski, Cracow (PL)

(73) Assignee: ABB Research Ltd., Zurich (CH)

( * ) Notice: Subject to any disclaimer, the term of this patent is extended or adjusted under 35 U.S.C. 154(b) by 240 days.

(21) Appl. No.: 10/546,672

(22) PCT Filed: Feb. 2, 2004

(86) PCT No.: PCT/PL2004/000004

§ 371 (c)(1),
(2), (4) Date: Aug. 22, 2004

(87) PCT Pub. No.: WO2004/074850

PCT Pub. Date: Sep. 2, 2004

(65) Prior Publication Data

US 2006/0238688 A1    Oct. 26, 2006

(51) Int. Cl.
*G08B 29/06*   (2006.01)
*G02F 1/13*    (2006.01)
*G02F 1/1343*  (2006.01)
*G02F 1/1347*  (2006.01)

(52) U.S. Cl. .......................... 349/199; 349/73; 349/74; 349/139

(58) Field of Classification Search ................ 349/199, 349/73, 74, 139
See application file for complete search history.

(56) References Cited

U.S. PATENT DOCUMENTS

| 4,818,072 A | * | 4/1989 | Mohebban | 349/199 |
| 4,823,078 A | * | 4/1989 | Mohebban | 324/133 |
| 4,838,653 A | * | 6/1989 | Mohebban | 349/199 |

* cited by examiner

*Primary Examiner*—Andrew Schechter
*Assistant Examiner*—John Heyman
(74) *Attorney, Agent, or Firm*—Michael M. Rickin; Michael C. Prewitt

(57) ABSTRACT

The subject of the invention is a liquid crystal indicator of voltage presence in electric conductors and equipment. The device is used to indicate the presence of an AC voltage, especially in medium and high voltage systems. The indicator according to the invention comprises two substrate layers on which conducting layers are deposited, and a terminal being an external electric output of the indicator is connected to the conducting layer. A structure containing liquid crystal is located between these layers. A fragment of each segment deposited on one substrate layer overlaps with at least one fragment of a segment deposited on the other substrate layer, and the overlapping fragments of the conducting segments from both substrate layers, together with a part of the intermediate liquid crystal layer, form liquid crystal elements of the indicator, which are electrically connected in series.

6 Claims, 4 Drawing Sheets

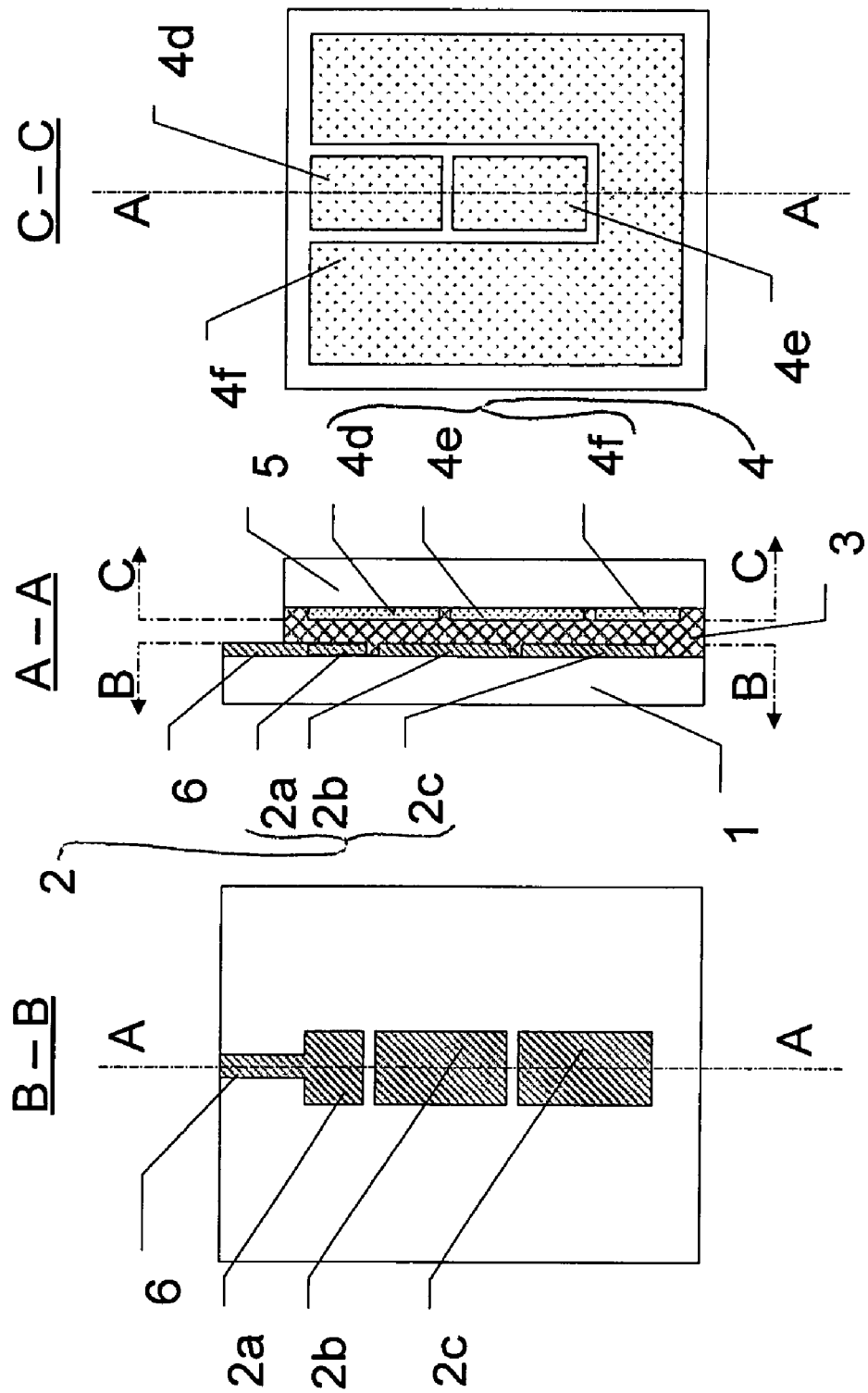

LIQUID-CRYSTAL INDICATOR OF VOLTAGE PRESENCE

The subject of the invention is a liquid crystal device indicating the presence of voltage in electric conductors and equipment. The device, which has the form of a liquid crystal display, is used to indicate voltage presence, especially in medium and high voltage systems.

BACKGROUND

The use of liquid crystal displays to detect and indicate voltage presence is known from numerous solutions. By way of example, U.S. Pat. No. 4,112,361 reveals a liquid crystal voltmeter, in which a nematic liquid crystal is placed between a pair of semitransparent electrodes, which are deposited on the surfaces of polarizing substrate plates. One electrode is a thin resistive layer and the other electrode is a conducting layer. A source of direct-current (DC) voltage is connected to both ends of the resistive electrode and the conducting electrode is grounded. On the surface of one of the polarizing substrate plates there is placed a suitable scale indicating the value of the measured voltage that occurs between the electrode with resistive film and the ground.

A contactless electrostatic voltage sensor, which detects voltage that occurs on electrically charged surfaces is known from another U.S. Pat. No. 4,786,858. The sensor comprises a liquid crystal cell with two electrodes, of which one is electrically coupled through a capacitor having a mechanically controlled diaphragm with the charged surface whose voltage is to be measured, and the other is grounded. The diaphragm is connected to a reference voltage source. In addition, charging voltage is connected directly to the first electrode of the liquid crystal cell in order to charge the cell to a predetermined voltage.

The presented devices cannot be used to detect and/or indicate the presence of alternating-current (AC) voltage in medium and high voltage systems. In particular, the device described in the U.S. Pat. No. 4,112,361 is applicable mainly to measurement of DC voltages not higher than the threshold voltage of the used liquid crystal cell. AC voltage measurement is possible with the described device only when a reference AC voltage which is phase-compatible with the measured voltage is supplied. The need to supply such a reference voltage in the case of medium and high voltage systems would present a serious difficulty.

On the other hand, the device described in the U.S. Pat. No. 4,786,858 finds application in measuring DC voltage generated by an electrostatic charge accumulated on photosensitive elements of electrophotographic devices, thus it is not intended for measuring AC voltage. Moreover, in medium and high voltage equipment, electrostatic charges accumulate on the surface of conductors in an uncontrolled manner and a measurement made by such a device would be useless.

Liquid crystal cells and displays of various types show direct sensitivity to AC voltage and electric field. When AC voltage exceeding a given threshold value is applied to the electrodes of a liquid crystal cell, it generates an electrostatic field inside the cell of an intensity which changes its optical properties. Application of such voltage is also connected with the flow through the cell of electric current of intensity depending on the value of the applied voltage and the resistive and capacitive characteristics of the cell. In liquid crystal displays, a suitable shape of the electrodes makes it possible to apply voltage to localized cell fragments and to obtain visible contrast.

For typical liquid crystal cells of the type TN (twisted nematic), the AC voltage threshold value required to obtain the maximum optical effect is approximately 2V RMS (RMS—root-mean-square) at a frequency of approximately 50 Hz. At this threshold voltage, a current per surface area unit of approximately 1.5 $\mu A/cm^2$ RMS flows through the cell. For typical cells of the type PDLC (polymer-dispersed liquid crystal) the intensity of the corresponding threshold current is approximately 15 $\mu A/cm^2$ RMS per surface area unit at a 50 Hz frequency.

The existence of the threshold values of the AC voltage for liquid crystal cells and displays makes it possible to use them for contactless detection AC voltages. In particular, in the vicinity of every conductor connected to AC voltage there is an AC electric field, which also generates the flow of an electric current through the surface of the conductor. Such capacitive current flows in the direction parallel to the direction of the electric field, and the RMS intensity of this current I, measured per unit of surface area S, which is perpendicular to the direction of the capacitive current flow, is:

$$I/S = 2\pi\nu \in_0 \in E,$$

where v is the frequency, $\in_0$ is the vacuum electric permittivity, $\in$ is the dielectric constant of the material, and E is the RMS value of the electric field intensity.

Such a capacitive current can be used to indicate the presence of voltage being its source, by using it directly to energize a liquid crystal cell or display, and a change in the optical properties of the cell or display indicates the presence of a voltage exceeding a specific threshold.

In order to use the capacitive current associated with the electric field arising around live conductors to energize the indicator, a current-collecting electrode in the form of a flat conducting element placed in a plane perpendicular to direction of the electric field is typically used. The surface area of the current-collecting electrode must be sufficient to energize the liquid crystal elements activated when indicating voltage and to ensure a sufficient sensitivity of the indicator.

The current-collecting electrodes that are positioned parallel to the direction of the electric field can also energize the indicator. However, such positioning of the electrodes causes a local considerable increase in the electric field and may cause discharges, which have and adverse effect on electric power equipment.

A display detecting live wires is known from published Japanese patent application No. 61-003069. This device is intended to detect electric field near live conductors by using the threshold voltage of a liquid crystal display. A known two-electrode liquid crystal display (LCD) is provided with two additional electrodes, of which one is fixed to the front side of the display, and the other is fixed to its rear side, where side is understood to be this one which is placed on the surface of the object that is to be tested for the presence of electric field in its vicinity. Both electrodes of the display are electrically connected with the additional electrodes in such a way that each additional electrode is connected with a different electrode of the LCD. Due to the additional electrodes, the potential difference between the two electrodes of the liquid crystal element of the display, generated by the electric field of the tested object exceeds the display threshold value. When the tested object is live, the display shows the presence of voltage, which can be seen in the display window. In the presented solution, the device sensitivity sufficient to detect voltage presence was obtained by connecting additional external collecting electrodes to this display.

Another display used to indicate voltage presence is known from published Japanese description No. 63044173. Similarly to the device presented in description JP 61-003069, this device comprises a liquid crystal display and two additional current-collecting electrodes, of which one is galvanically connected with one, sign electrode of the display, whereas the other, which is transparent, is placed directly on the surface of the display and thereby capacitively coupled with the other, common electrode of the display. In this solution, the sufficient sensitivity of the device is achieved by providing an adequately large surface area of the additional current-collecting electrodes in relation to the surface area of the sign electrode of the display.

U.S. Pat. No. 4,818,072 and U.S. Pat. No. 4,838,653, both filed by Raychem Corporation, present a device for detecting voltage in electric cables or equipment and/or for detecting electric field generated in the vicinity of an electric device or equipment. The device has the form of a liquid crystal display, which is a liquid crystal cell whose electrodes are shaped as flat segments electrically separated from each other. Those electrodes are deposited on two substrate layers parallel to one another, and they are arranged so that a fragment of each segment deposited on one substrate layer overlaps with at least one fragment of the segment deposited on the other substrate layer. The overlapping segment fragments from both substrate layers form liquid crystal elements of the display, which are electrically connected with each other in series. The first liquid crystal element in non-energized state has electric capacitance lower than the capacitance of each other liquid crystal element of this cell, and the second liquid crystal element connected in series with the first liquid crystal element has basically the same size as the first element, and its capacitance in non-energized state is lower than the capacitance of the first liquid crystal element in energized state. In this solution, the connection of liquid crystal elements in series makes it possible to activate a given surface area of the display with electric current lower than in the solutions presented in the Japanese descriptions Nos. 61-003069 and 63-044173. Despite this, due to the small surface area of the conducting segments, the sensitivity of the device to the electric field is small, especially when the display is positioned in the plane perpendicular to the direction of the electric field. When the display is positioned in the plane parallel to direction of electric field, the sensitivity of the indicator increases, but such placement is not recommended for use with electric power equipment, because of the possibility of generating discharges.

A photoelectric sensor of electric field is known from published Japanese description No. 10260212. It comprises a liquid crystal located between overlapping electrodes, capacitively connected in series. It also comprises dipole antennas, which are electrically connected with the electrodes. In this solution, the sufficient sensitivity of the device is achieved by connecting additional dipole antennas of sufficiently large size to the LCD.

A disadvantage of all those presented solutions, when they are applied to electric power equipment, is that obtaining sufficient sensitivity of the device requires either attaching to the LCD additional external elements, which are much larger than the display itself, or considerably increasing the size of the display in relation to the size of the surface activated in the display during the indication of voltage or an electric field, or positioning the display in a plane parallel to the direction of the electric field, which can be a cause of discharges.

SUMMARY OF THE INVENTION

A passive liquid crystal voltage indicator according to the first variant of the invention, comprising the first substrate layer with the first conducting layer deposited on its surface, the second substrate layer parallel to the first layer, with the second conducting layer deposited on its surface, facing the first conducting layer, at least one of the conducting layers being transparent, and comprising an intermediate layer located between the substrate layers, which intermediate layer is a structure comprising liquid crystal and changing its optical properties in an AC electric field, and each of the conducting layers is divided into at least two segments which do not touch one another, is characterized in that the segments of the second conducting layer, deposited on the second substrate layer, are shaped so that one segment is larger than each of the other smaller segments of this layer, whereas the segments of the first conducting layer deposited on the first substrate layer are shaped similarly to the smaller segments of the second conducting layer. The configuration of the segments of both conducting layers is such that one end segment of the first conducting layer, which segment is provided with a terminal being an external electric terminal of the indicator, is situated opposite a fragment of the surface of one smaller segment of the second conducting layer, and the other segments of the first conducting layer, excluding the second end segment of the first conducting layer, are situated in sequence, each one opposite the fragments of the surface of two neighboring smaller segments of the second conducting layer. The second end segment of the first conducting layer is situated opposite a fragment of the surface of a smaller segment of the second conducting layer and opposite a fragment of the surface of the larger segment of this layer.

A liquid crystal voltage indicator according to the second variant of the invention, comprising the first substrate layer with conducting segments electrically isolated from each other deposited on its surface, the second substrate layer parallel to the first layer, with conducting segments electrically isolated from each other deposited on its surface, at least one of the substrate layers and the segments deposited on it being at least partly transparent, and comprising an intermediate liquid crystal layer located between the substrate layers with the conducting segments, and the configuration of the conducting segments on both substrate layers being such that a fragment of each segment deposited on one substrate layer overlaps with at least one fragment of a segment deposited on the second substrate layer, and the overlapping fragments of the conducting segments from both substrate layers, together with a part of the intermediate liquid crystal layer, form liquid crystal elements of the indicator, which are electrically connected in series in such a way that one liquid crystal element is electrically connected with the next element through a common conducting segment, and all liquid crystal elements, in the section plane parallel to the substrate layers, form together an image of the sign which is displayed in the event of presence of voltage, and to one of the conducting segments there is connected an electric terminal leading outside the area of the intermediate liquid crystal layer, is characterized in that the whole area of the conducting segment located on the surface of the substrate outside the area of the sign image is a current-collecting electrode of the indicator, and the liquid crystal elements are shaped so that the projection of one liquid crystal element on the plane of one of the substrate layers has the form of a strip bordering the outside contour of the displayed sign image, and the edges of the ends of this strip are situated in the near neighborhood of the edge of the intermediate liquid crystal layer, while the projections of the other liquid crystal elements are situated within the area of the sign image delimited by this strip.

Preferably, in the second variant of the invention, the sign image is composed of many symbols separated from each other, each of which is made up of many liquid crystal elements, and in each symbol at least one liquid crystal element comprises a conducting segment electrically connected with the terminal through its parallel branching.

Preferably, in the second variant of the invention, the intermediate liquid crystal layer contains nematic liquid crystal.

Preferably, in the second variant of the invention, the intermediate liquid crystal layer contains liquid crystal closed in a polymer matrix.

Preferably, in the second variant of the invention, the surface areas of the projection of at least two successive liquid crystal elements are basically identical.

Preferably, in the second variant of the invention, the surface areas of the projection of successive, neighboring with one another, liquid crystal elements change in ascending or descending manner.

The advantage of the liquid crystal voltage indicator according to the invention is its high sensitivity and, at the same time, its small size, its simple structure and the possibility of its manufacturing by known, optimized methods used to manufacture liquid crystal displays. In addition, the display is characterized by long fault-free operation, which is especially important when it is used with high and medium voltage transmission and distribution systems. Also, the voltage indicator does not require the use of a source of power. Indication is based only on its sensitivity to electric field present in the close vicinity of life conductors and equipment and the reading can be done with unaided eye from a safe distance.

An additional advantage of the liquid crystal voltage indicator according to the second variant of the invention is an even distribution of electric fields inside the indicator between its conducting elements, and the resulting possibility of working in a broader range of voltages. In particular, the voltage between the current-collecting electrode of the indicator and the indicator terminal is, due to the presented shape of the conducting segments of the indicator, distributed everywhere basically uniformly and without significant gradients.

BRIEF DESCRIPTION OF THE DRAWINGS

The exemplary embodiment of the subject of the invention is presented in the drawing, where;

FIG. 1 shows an embodiment of the first indicator variant with the first and the second conducting layers divided into segments in a section along line A-A, FIG. 1a—a fragment of the indicator from FIG. 1 in a section along line B-B, FIG. 1b—a fragment of the indicator from FIG. 1 in a section along line C-C.

DETAILED DESCRIPTION OF THE INVENTION

Figures 2, 2A, 2B:
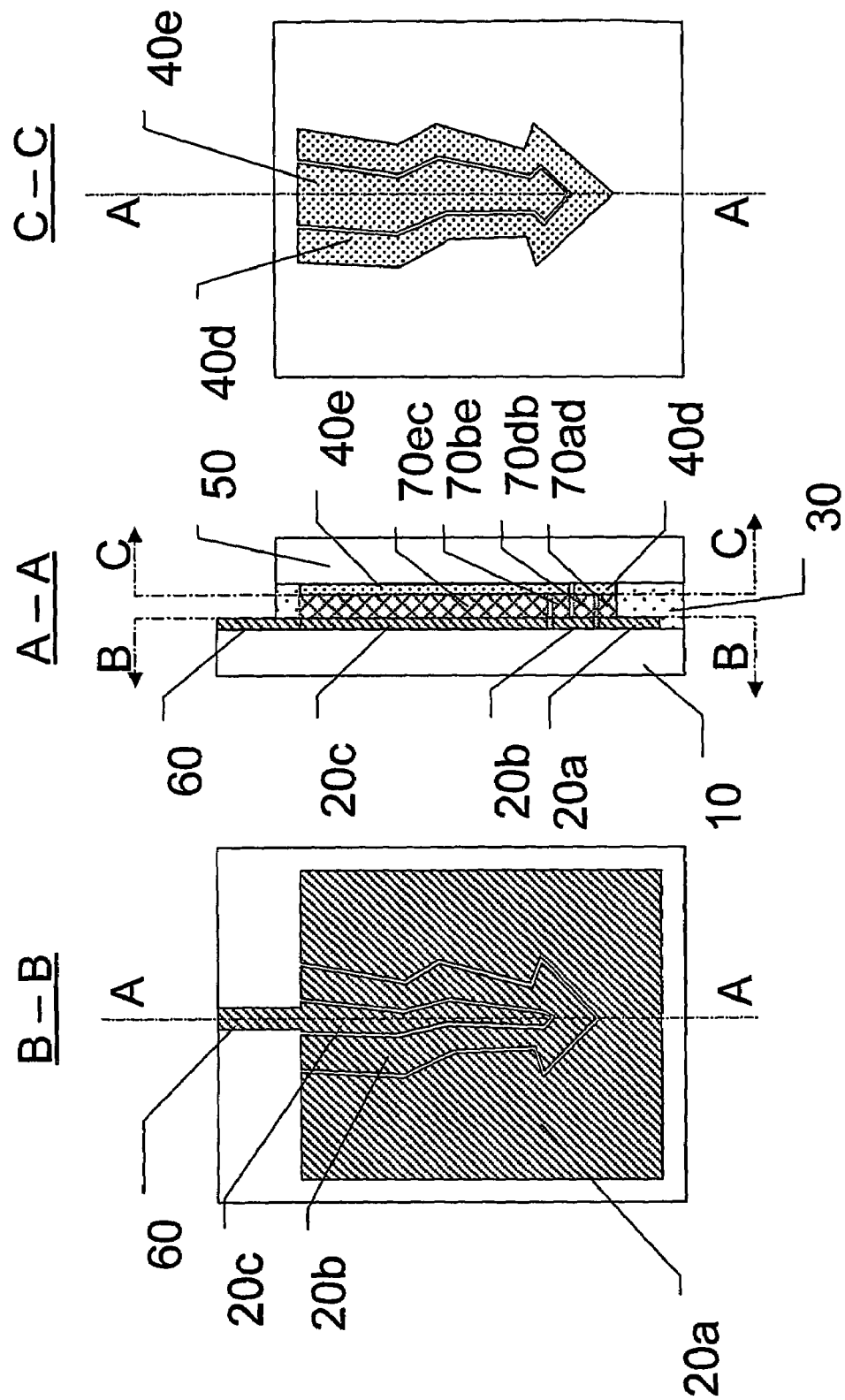
FIG. 2 shows another embodiment of the indicator in a transverse section A-A, FIG. 2a—a fragment of the indicator from FIG. 2 in a section along line B-B, FIG. 2b—a fragment of the indicator from FIG. 2 in a section along line C-C, FIG. 3—the indicator in a transverse section in a plane perpendicular to the section from FIG. 2, FIG. 4—a system of liquid crystal elements forming the sign Z in the shape of an arrow, with the current-collecting electrode and the terminal, viewed in a projection on the substrate layer, FIG. 5—another arrangement of liquid crystal elements forming the sign Z having the shape of the letters "ON", together with the current-collecting electrode and the terminal, viewed in a projection on the substrate layer, and FIG. 6—an example of a practical application of the indicator.

The liquid crystal voltage indicator according to the first variant embodiment of the invention is a multilayer plate comprising:
 the first substrate layer 1,
 the first conducting layer 2, divided into conducting segments 2a, 2b, 2c and adjoining the first substrate layer on its one side,
 an intermediate layer 3, adjoining the first conducting layer 2,
 the second conducting layer 4, divided into conducting segments 4d, 4e, 4f and adjoining the intermediate layer 3 on its other side,
 the second substrate layer 5.

The intermediate layer 3 is a structure, which contains liquid crystal and which changes its optical properties in an AC electric field.

Both conducting layers 2 and 4 are divided into the same number of segments, the first conducting layer 2 being transparent. Segments 4d, 4e and 4f of the second conducting layer 4 are shaped so that one bigger segment 4f is larger than each of the other smaller segments 4d and 4e of this layer. Segments 2a, 2b and 2c of the first conducting layer are shaped in a way similar to the smaller segments of the second conducting layer, the configuration of the segments of the two conducting layers being such that one end segment 2a of the first transparent layer is provided with a terminal 6 being an external output lead of the display, and it is positioned opposite a fragment of the surface of one smaller segment 4d of the second conducting layer. The other segments of the first conducting layer, excluding the second end segment 2c of the first conducting layer, are situated in sequence, each opposite a fragment of the surface of the two neighboring smaller segments of the second conducting layer, while the second end segment 2c of the first conducting layer is positioned opposite a fragment of the surface of the smaller segment 4e of the second conducting layer and opposite a fragment of the surface of the bigger segment 4f of this layer. The bigger segment 4f shown in the exemplary embodiment in FIG. 1b has the shape of the capital letter "U", and the smaller segments 4d and 4e have the shape of rectangles and are arranged on the substrate layer 1, between the arms of the letter "U".

The liquid crystal voltage indicator made according to the second embodiment variant of the invention is a multilayer structure comprising the first and the second substrate layers 10 and 50, the conducting segments 20a, 20b, 20c and 40d, 40e, which are deposited, by an arbitrary method of producing thin-film layers, on the surfaces of the substrate layers 10 and 50 facing one another, and an intermediate liquid crystal layer 30, located between the substrate layers 10 and 50 and between the conducting segments 20a, 20b, 20c and the conducting segments 40d and 40e. At least one substrate layer and the segments deposited on it are at least partly transparent. The conducting segments 20a, 20b, 20c, which are deposited on the substrate layer 10 are electrically isolated from one another. The segments 40d and 40e, which are deposited on the substrate layer 50, are also insulated from one another. In this exemplary embodiment of the invention, the number of conducting segments deposited on both substrate layers is limited to five, but in a practical embodiment of the indicator it can have any number of segments.

Figure 3:
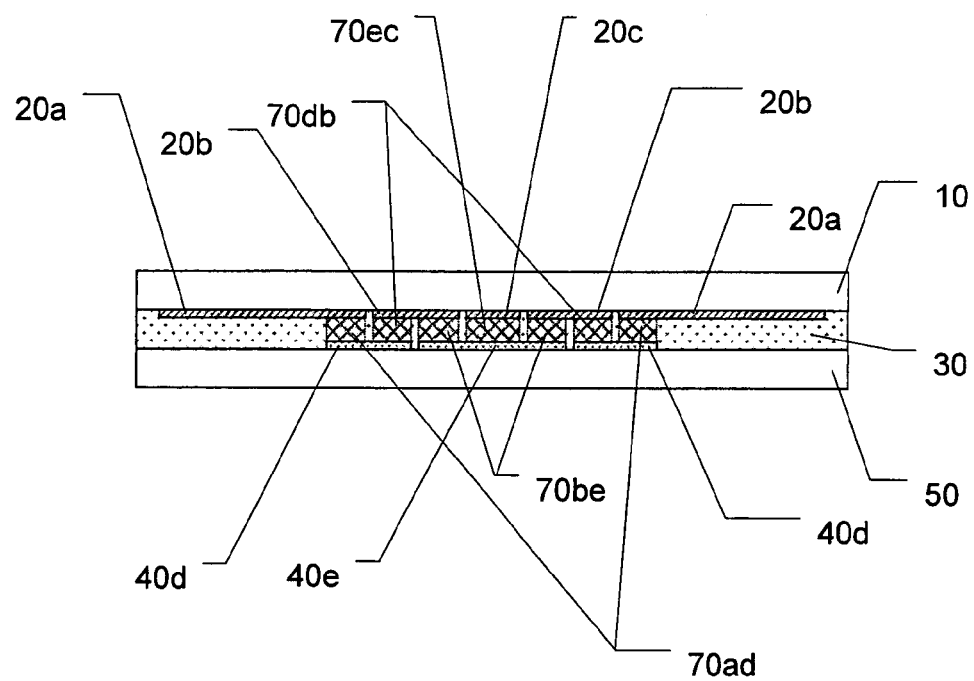
Figure 4:
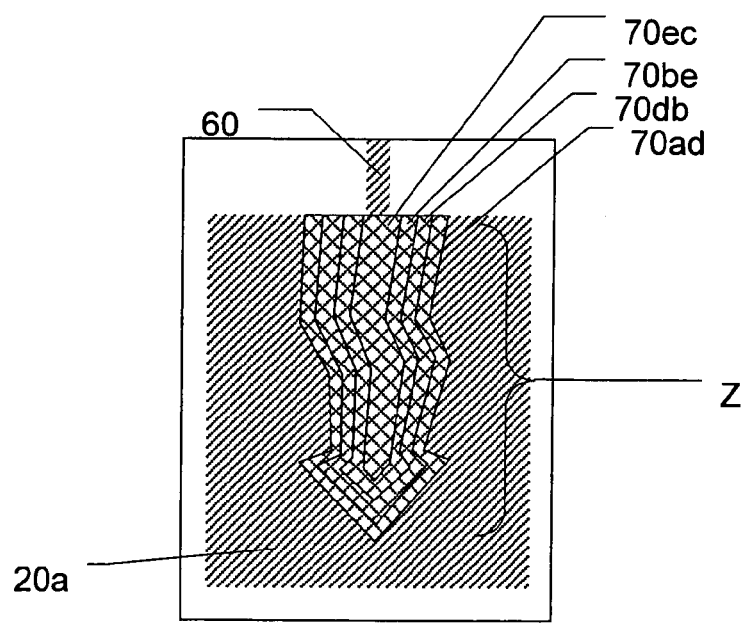

The configuration of the conducting segments 20a, 20b, 20c and 40d, 40e is such that in the orthogonal projection of one substrate layer on the other, a fragment of each segment 20a, 20b and 20c of the first substrate layer 10 overlaps with at least one fragment of the conducting segment 40d, 40e of the second substrate layer 50. The overlapping fragments of the conducting segments from both substrate layers together with a part of the intermediate liquid crystal layer 30 form the liquid crystal elements of the display 70ad, 70db, 70be, 70ec, which are connected into an electric series, which is shown in FIG. 3. In particular, the element 70ad is electrically connected with the element 70db through the segment 40d, the element 70db is electrically connected with the successive element 70be through the common conducting segment 20b, and the element 70be is electrically connected with the element 70ec through the segment 40e. All the liquid crystal elements 70ad, 70db, 70be, 70ec in a projection on the plane of the substrate layers 10 and 50 form an image of the sign Z in the shape of an arrow, which is displayed in the event of voltage presence, which sign Z is shown in FIG. 2 and FIG. 4.

As shown in FIG. 2b, the conducting segment 40d has the shape of a geometric figure in the form of a strip adjoining the outside contour of the displayed arrow, and the edges of the ends of this strip are positioned in the near neighborhood of the edges of the intermediate liquid crystal layer 30. The segment 20b is shaped similarly to the segment 40d. The segment 40e fills the surface of the sign delimited by the segment 40d, and segment 20c fills the surface of the sign delimited by the segment 20b. A terminal 60, leading outside the intermediate liquid crystal layer 30, is connected to the segment 20c. In the embodiment example shown in FIG. 2 and FIG. 4 the terminal 60 is deposited on the substrate layer 10 using the same technique as in the case of the conducting segments 20a, 20b and 20c.

As shown in FIG. 2a, the segment 20a occupies the largest area on the substrate layer 10, and its area is many times bigger than the surface area of each other segment on this layer and it is also bigger than the total area of the other segments. This segment is the current-collecting electrode of the liquid crystal display, and the projection of the liquid crystal element 70ad lying in the area where this segment overlaps with the segment 40d has the shape of a strip adjoining the outside contour of the displayed sign image, and the edges of the ends of this strip are situated in the near neighborhood of the edge of the intermediate liquid crystal layer 30. The consecutive segments 20b, 40e and 20c are shaped in such a way that the projections of the liquid crystal elements 70db and 70be, similarly as the projection of the element 70ad, have the shape of strips consecutively adjoining one another and positioned in the inner area of the displayed arrow, whereas the edges of the ends of these strips are situated in the near neighborhood of the edge of the intermediate liquid crystal layer 30, and the projection of the liquid crystal element 70ec fills the surface of the sign Z delimited by the projection of the liquid crystal element 70be.

Figure 5:
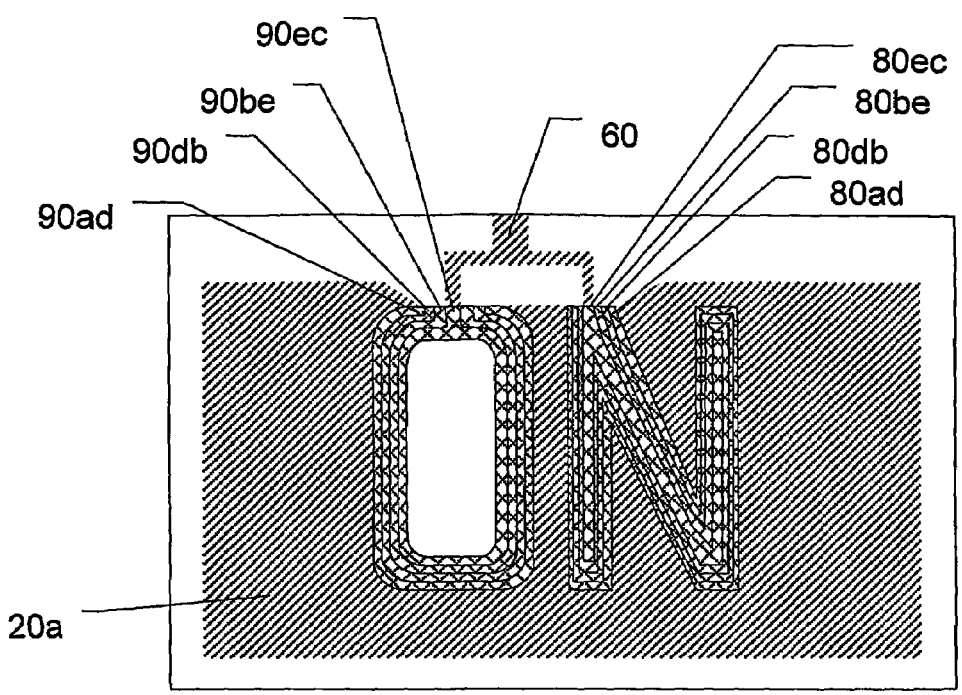

In another embodiment of the second variant of the invention shown in FIG. 5, the image of the sign Z has the form of two capital letters "O" an "N", where the letter "N" consists of liquid crystal elements of the display 80ad, 80db, 80be, 80ec, and the letter "O" consists of liquid crystal elements 90ad, 90db, 90be, 90ec, formed as in the previous embodiment, the display terminal 60 branching into two parallel electric leads, each of which is attached to a specific conducting segment of one of the letters "O" and "N". In this indicator embodiment, on one of the substrate layers 10 and 50 there is situated a fragment of the substrate, which does not have on its surface a conducting segment and which is the interior of the closed letter "O".

In the embodiment example the substrate layers 10 and 50 are made of glass. The conducting segments 20a, 20b, 20c, 40d and 40e and the terminal 60 are transparent and they are made of indium-tin oxide (ITO). Over the surface of the substrate layers 10 and 50 with deposited conducting segments there are deposited the alignment layers, which orientate the liquid crystal, and which are not shown in the drawing. Between the alignment layers there is placed a nematic liquid crystal confined by a seal (not shown in the drawing), which binds together the substrate layers 10 and 50 along their circumference. The alignment layers together with the liquid crystal located between them in the space confined by the seal form the intermediate liquid crystal layer 30 of the type TN (twisted nematic).

Figure 6:
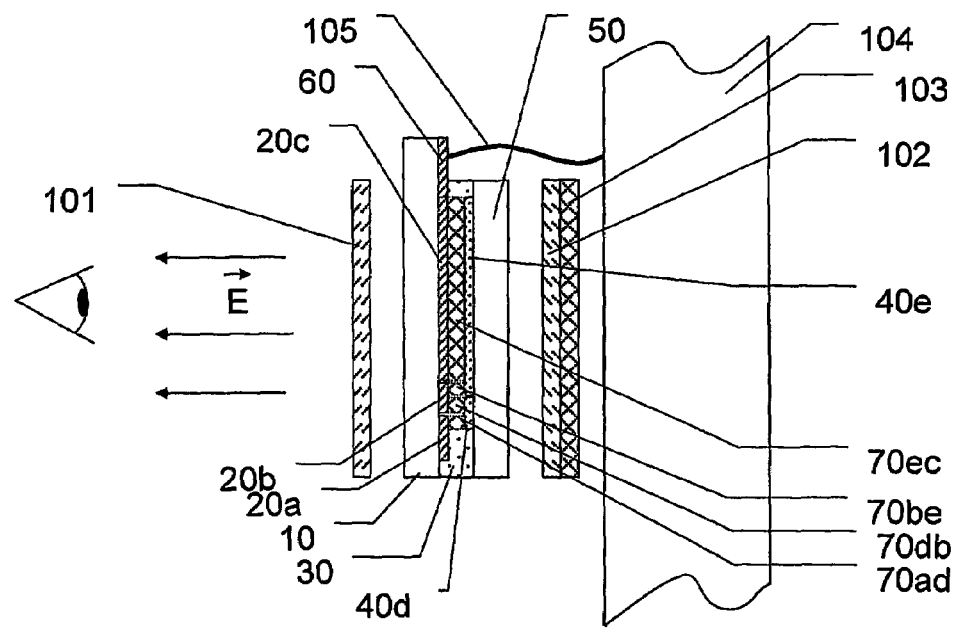

In order to use the described indicator to detect voltage, with a possibility of taking a reading with unaided eye, a polarizer 101 is placed near the external surface of the substrate layer 10, and a polarizer 102 and a reflector 103 are placed near the substrate layer 50, according to a known method of building reflective liquid crystal displays of the TN type. The terminal 60 is electrically connected with the tested electric conductor or element 104 by means of a connector 105, as shown in FIG. 6, and the whole voltage indicator is placed in a plane parallel to the surface of the tested object 104. Additionally, a dielectric separator can be placed between the reflector 103 and the tested element 104, which is not shown in the drawing, to reduce parasitic capacitance occurring between the conducting segments of the indicator and the tested element 104.

If the tested element 104 is not live, that is, when there is no potential difference between the tested element 104 and its surrounding, the indicator surface seen through the polarizer 101 is homogenous. When AC voltage is connected to the tested element 104, the AC electric field E occurring near the indicator surface generates an AC electric current flowing from the tested element 104 through the connector 105 and the terminal 60, through the series of the liquid crystal elements 70ec, 70be, 70db, 70ad to the conducting segment 20a, which is a current-collecting electrode, and further to the indicator surrounding through the capacitance between the current-collecting electrode and the surrounding. This current is enough to exceed the threshold value for the liquid crystal elements 70ec, 70be, 70db, 70ad. As a result, the liquid crystal within the surface of the sign Z is activated and a sign of an appropriate shape, which is visible with unaided eye, appears thus signaling the presence of voltage in the tested element 104.

As an alternative, the substrate layers 10 and 50 can be made of polymer, e.g. polyester, and the intermediate liquid crystal layer of the indicator 30 can be a structure with a liquid crystal in a polymer matrix.

As an alternative, instead of the galvanic connection 105 shown in FIG. 6 the terminal 60 can be capacitively coupled with the tested conductor or the element 104, which is not shown in the drawing.

As an alternative, instead of the connection with the element 104, the terminal 60 can be connected with an additional, at least partly transparent conducting layer placed in front of the substrate layer 10, which is not shown in the drawing. Then, the current which activates the indicator flows to the conducting segment 20*a*, which is the current-collecting electrode, through its capacitive coupling with the tested conductor or element 104.

Moreover, it is obvious that other connection arrangements can be made, which will allow for the use of the indicator in other configurations.

What is claimed is:

1. A liquid crystal voltage indicator comprising a first substrate layer having a surface with a first conducting layer deposited thereon, a second substrate layer being parallel to said first substrate layer, said second substrate layer having a surface with a second conducting layer deposited thereon and facing said first conducting layer, at least one of said conducting layers being transparent, an intermediate layer located between said substrate layers, said intermediate layer being a structure comprising liquid crystal and changing its optical properties in an alternating electric field, each of said conducting layers is divided into at least two segments which do not touch one another one of said segments of said second conducting layer being a larger segment and the other said segments of said second conducting layer being smaller than said larger segment, whereas said segments of said first conducting layer being shaped similarly to said smaller segments of said second conducting layer, wherein one of said segments of said first conducting layer is provided with an external electric terminal, said terminal being positioned opposite a fragment of one of said smaller segments of said second conducting layer, the other segments of said first conducting layer, excluding a second end segment of said first conducting layer, being situated in series sequence and positioned opposite fragments of two neighboring said smaller segments of said second conducting layer, said second end segment of said first conducting layer being on the end of the series sequence opposite said terminal and situated opposite a fragment of a one of said smaller segments of said second conducting layer and opposite a fragment of said larger segment of said second conducting layer.

2. A liquid crystal voltage indicator comprising a first substrate layer having a surface with a plurality of electrically isolated conducting segments deposited thereon, a second substrate layer is parallel to said first substrate layer, and includes a surface with a plurality of electrically isolated conducting segments deposited thereon, at least one of said substrate layers being at least partly transparent, an intermediate liquid crystal layer being located between said substrate layers, and the configuration of said conducting segments being such that a fragment of each said conducting segment on said first substrate layer overlaps with at least one fragment of a conducting segment on said second substrate layer, and the overlapping fragments of said conducting segments from both said substrate layers, together with a part of said intermediate liquid crystal layer, form liquid crystal elements, which are electrically connected in series in such a way that each said liquid crystal element is electrically connected with the adjacent liquid crystal element through a common conducting segment, and all said liquid crystal elements, form an image which displays when in the presence of voltage, wherein an electric terminal is connected to one of said conducting segments, said electric terminal leading outside the area of the intermediate liquid crystal layer, the portion of said conducting segments located outside the area of said image forms a current-collecting electrode, and said liquid crystal elements are shaped so that one of said liquid crystal elements forms a strip at the outside contour of said image, and the ends of said strip are situated proximate to an edge of said intermediate liquid crystal layer, other of said liquid crystal elements being situated within the area of said image delimited by said strip.

3. A liquid crystal indicator according to claim 2, wherein said image is composed of a plurality of symbols separated from each other, each of said symbols being made up of a plurality of said liquid crystal elements, and in each said symbol at least one said liquid crystal element comprises one of said conducting segments electrically connected with said terminal through a parallel branching arrangement.

4. A liquid crystal indicator according to claim 2, wherein said intermediate liquid crystal layer contains nematic liquid crystal.

5. A liquid crystal indicator according to claim 2, wherein said intermediate liquid crystal layer contains liquid crystal closed in a polymer matrix.

6. A liquid crystal indicator according to claim 2, wherein the surface areas of at least two successive liquid crystal elements are substantially similar.

\* \* \* \* \*